(12) United States Patent
Vincent et al.

(10) Patent No.: US 9,117,777 B2
(45) Date of Patent: Aug. 25, 2015

(54) METHODS FOR MANUFACTURING SEMICONDUCTOR DEVICES

(71) Applicant: IMEC, Leuven (BE)

(72) Inventors: Benjamin Vincent, San Francisco, CA (US); Geert Eneman, Balen (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/106,699

(22) Filed: Dec. 13, 2013

(65) Prior Publication Data
US 2014/0170837 A1    Jun. 19, 2014

(30) Foreign Application Priority Data

Dec. 13, 2012    (EP) .................................... 12196929

(51) Int. Cl.
| | |
|---|---|
| *H01L 21/322* | (2006.01) |
| *H01L 21/02* | (2006.01) |
| *H01L 29/78* | (2006.01) |
| *H01L 29/66* | (2006.01) |
| *H01L 21/762* | (2006.01) |

(52) U.S. Cl.
CPC ...... *H01L 21/3225* (2013.01); *H01L 21/02532* (2013.01); *H01L 21/02694* (2013.01); *H01L 29/66795* (2013.01); *H01L 29/785* (2013.01); *H01L 21/762* (2013.01)

(58) Field of Classification Search
None
See application file for complete search history.

(56) References Cited

U.S. PATENT DOCUMENTS

| | | | |
|---|---|---|---|
| 2001/0050397 A1* | 12/2001 | Matsumoto et al. ......... 257/347 |
| 2002/0037643 A1* | 3/2002 | Ishimaru ...................... 438/642 |
| 2007/0123010 A1 | 5/2007 | Hoentschel et al. |
| 2007/0141775 A1* | 6/2007 | Teo et al. ..................... 438/231 |
| 2008/0121932 A1* | 5/2008 | Ranade ........................ 257/192 |
| 2008/0171423 A1 | 7/2008 | Ieong et al. |
| 2012/0068193 A1 | 3/2012 | Chan et al. |

OTHER PUBLICATIONS

European Search Report, European Patent Application No. 12196929.9, dated Apr. 25, 2013.
Bolkhovityanov, Yu B. et al., "Ge-on-Si Films Obtained by Epitaxial Growing: Edge Dislocations and Their Participation in Plastic Relaxation", Semicond. Sci. Technol., vol. 27, No. 4, Apr. 4, 2012, pp. 1-12.

(Continued)

*Primary Examiner* — Charles Garber
*Assistant Examiner* — Brigitte Paterson
(74) *Attorney, Agent, or Firm* — McDonnell Boehnen Hulbert & Berghoff LLP

(57) ABSTRACT

A method for reducing defects from an active layer is disclosed. The active layer may be part of a semiconductor in a semiconductor device. The active layer may be defined at least laterally by an isolation structure, and may physically contact an isolation structure at a contact interface. The isolation structure and the active layer may abut on a common substantially planar surface. The method may include providing a patterned stress-inducing layer on the common substantially planar surface. The stress-inducing layer may be adapted for inducing a stress field in the active layer, and induced stress field may result in a shear stress on a defect in the active layer. The method may also include performing an anneal step after providing the patterned stress-inducing layer on the common substantially planar surface. The method may additionally include removing the patterned stress-inducing layer from the common substantially planar surface.

17 Claims, 14 Drawing Sheets

(56) References Cited

OTHER PUBLICATIONS

Bai, J. et al., "Study of the Defect Elimination Mechanisms in Aspect Ratio Trapping Ge Growth", Applied Physics Letters, vol. 90, vol. 10, Mar. 5, 2007, pp. 101902-1-101902-3.

Patel, J.R. et al., "Velocities of Individual Dislocations in Germanium", Journal of Applied Physics, vol. 42, No. 9, Aug. 1971, pp. 3298-3303.

* cited by examiner

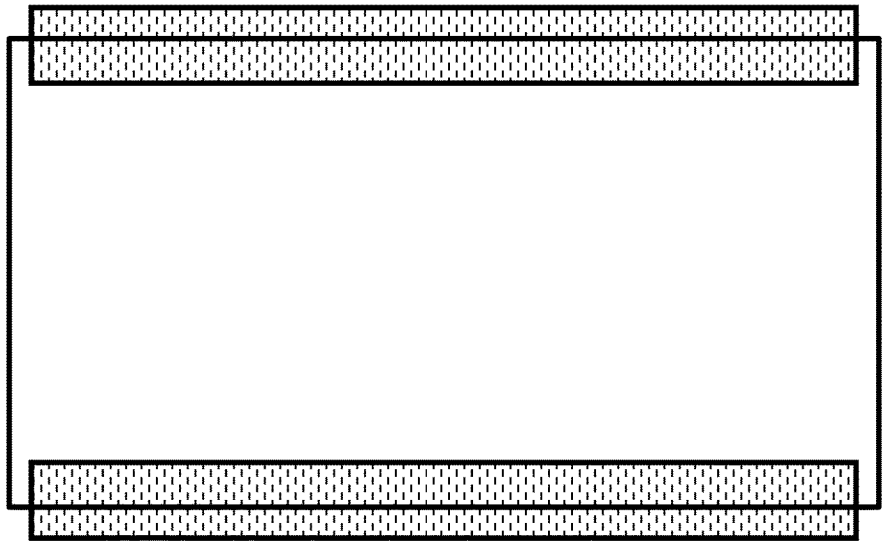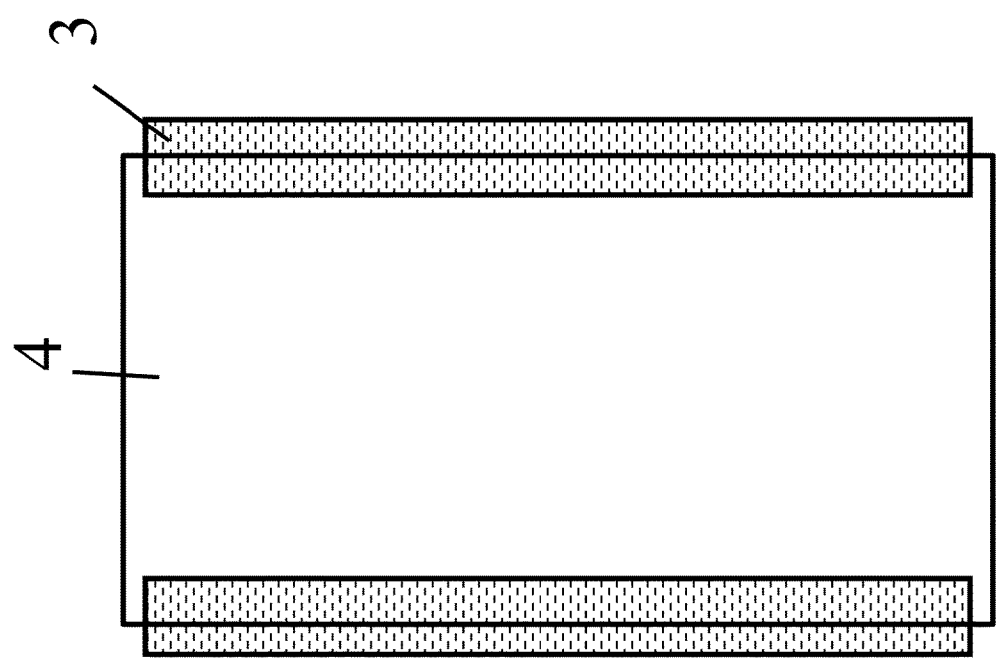
Fig. 10

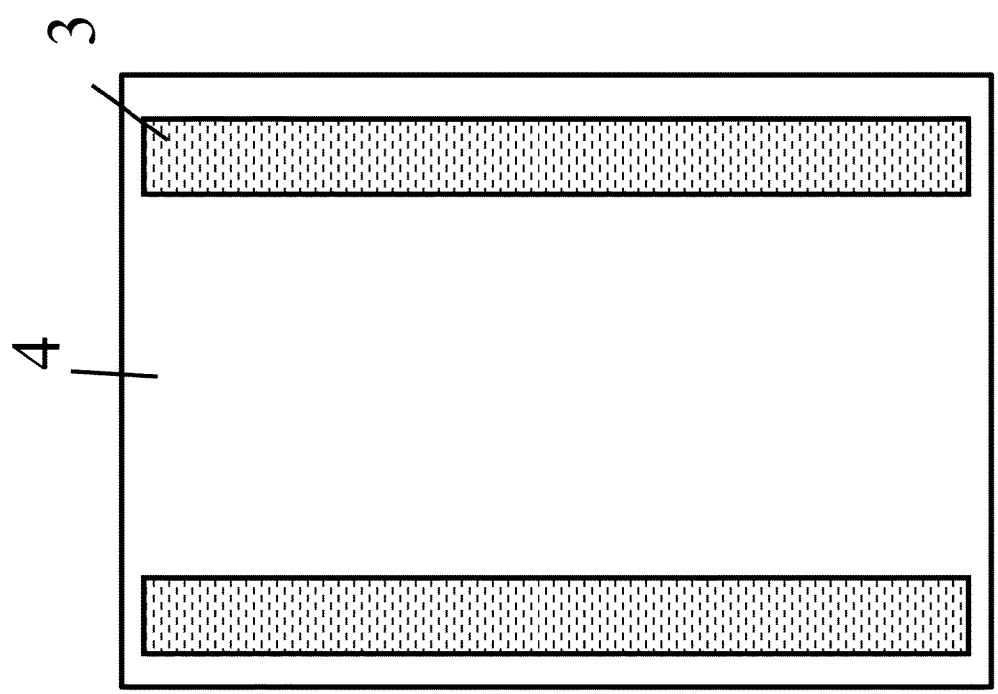
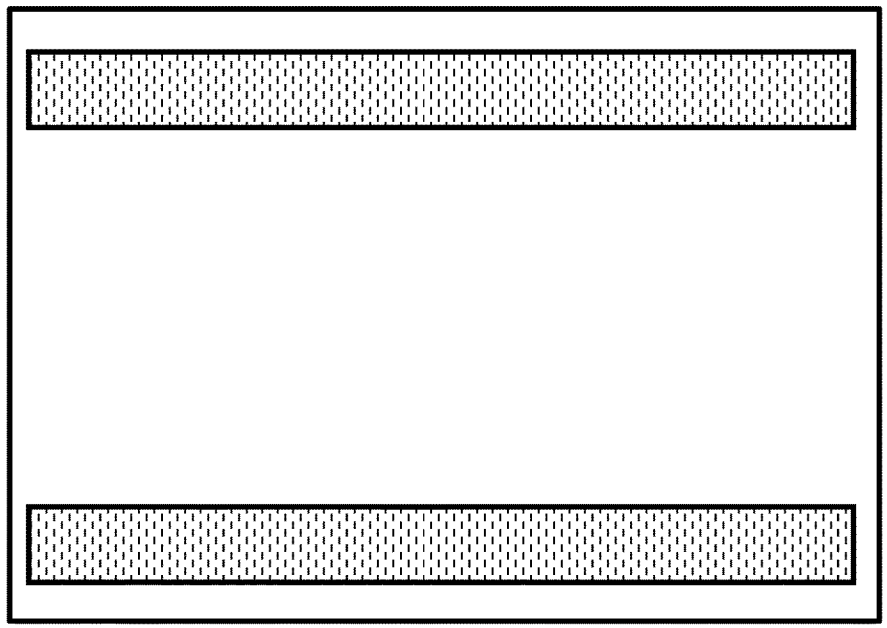
Fig. 11

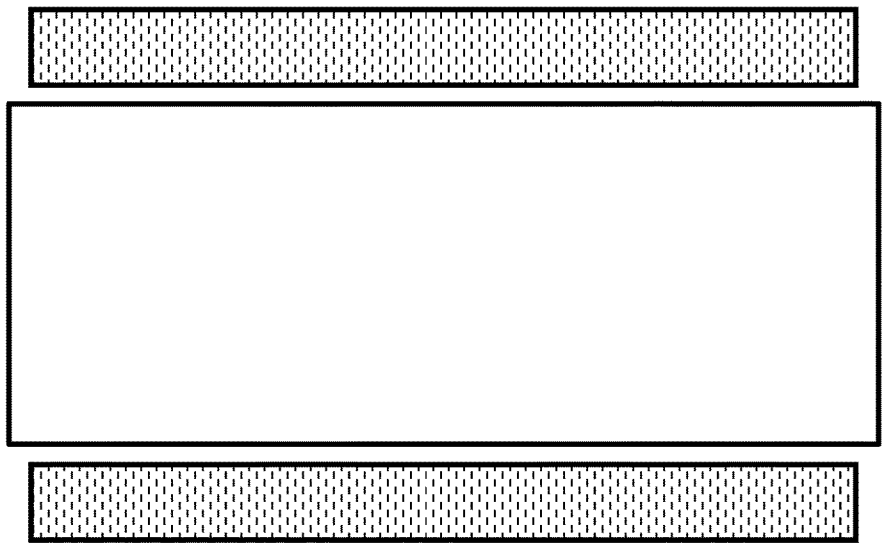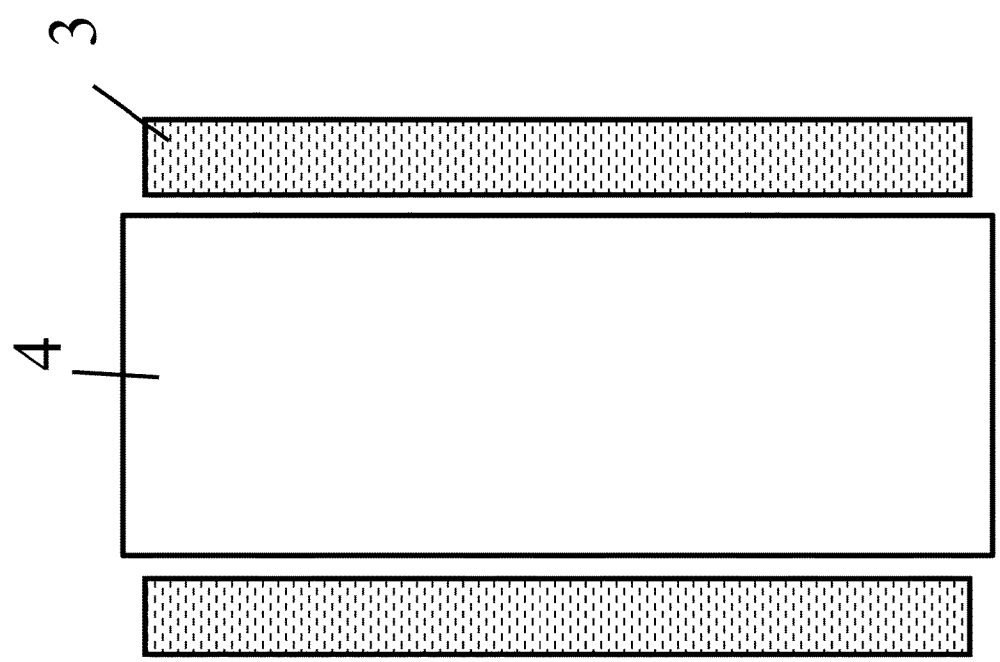
Fig. 12

METHODS FOR MANUFACTURING SEMICONDUCTOR DEVICES

CROSS-REFERENCE TO RELATED APPLICATION

This application claims priority to European Patent Application No. 12196929.9 filed on Dec. 13, 2012, the contents of which are hereby incorporated by reference.

TECHNICAL FIELD

The present disclosure relates to methods for manufacturing semiconductor devices. In certain aspects, it relates to methods for manufacturing active layers of semiconductor devices, as for instance channel layers of transistor devices with a reduced level of defects and improved performance.

BACKGROUND

Hetero-epitaxial growth of a semiconducting material, e.g., silicon germanium (SiGe) or germanium (Ge), on another semiconducting material, e.g., silicon (Si), often results in defects, for instance dislocations, due to, for instance, the mismatch in lattice constants.

Growth in confined spaces, as performed with the technique of Aspect Ratio Trapping (ART), can reduce defects that are growing near the edges of the confined space (e.g., towards a shallow trench isolation (STI)). See, e.g., Bai, J. et al., *Study of the defect elimination mechanisms in aspect ratio trapping Ge growth*, Applied Physics Letters, Volume 90, Issue 10, ID. 101902 (2007). This technique does not provide a solution for reducing defects as for instance dislocations near the center of the active device or active device layer. The presence of defects, as for instance dislocations, in an active device layer, as for instance a channel layer of a transistor device, is especially a concern for FinFETs and similar devices, wherein high mobility channel materials are integrated onto Silicon wafers.

SUMMARY

It is an aim of the present disclosure to provide a method for reducing defects, for instance dislocations, for instance threading dislocations, from at least one active layer, the active layer being part of a semiconductor device, or of a semiconductor in a device, and the active layer at least laterally being defined by an isolation structure and being physically in contact therewith by means of a contact interface, the isolation structure and the active layer(s) abutting on a common substantially planar surface.

This aim is achieved according to the disclosure with the method showing the technical characteristics of the first independent claim, namely:
  providing a patterned stress-inducing layer on the common substantially planar surface, the stress-inducing layer being adapted for inducing a stress field in the active layer, the induced stress field resulting in a shear stress on defects, for instance dislocations as for instance threading dislocations, present in the active layer;
  performing an anneal step after providing the patterned stress-inducing layer on the common substantially planar surface, thereby optionally inducing a movement of the defects, for instance, dislocations, towards the contact interface; and
  removing the patterned stress-inducing layer from the common substantially planar surface.

It is an advantage of the present disclosure that defects, such as, for instance, dislocations, can be strongly reduced or completely removed from an active layer of a semiconductor device.

It is a further advantage that defects can be strongly reduced or completely removed from a central region of an active semiconductor device layer.

An active device layer of a semiconductor device can be a layer in which charge carriers flow from one electrode to another, whereby the flow can be controlled either inherently, like a diode, or explicitly, e.g., the source to the drain in a field effect transistor (FET), whereby the flow of charge is controlled by a gate. An active layer or layer stack can comprise an electrically controllable material, such as a semiconductor material, configured to provide an electrical function, such as a diode function, or whose electrical conductivity can be modulated by a control electrode such as a gate.

For the purpose of the present disclosure, a dislocation can be a crystallographic line defect, or irregularity, within a crystal structure. The crystallographic line defect can be for instance a threading dislocation.

It will be appreciated that the actual required stress would depend upon the device dimensions, materials, and annealing temperatures. According to preferred embodiments, the intrinsic stress in the patterned stress-inducing layer is between about 100 MPa and about 5 GPa. Either compressive or tensile stresses can be used.

In preferred embodiments of the present disclosure, the active device layer is a Ge layer, or may comprise Ge. It can be a SiGe layer. According to preferred embodiments, the active device layer is or comprises $Si_xGe_{1-x}$, wherein x is between 0 and 0.8, or between 0 and 0.7, or between 0 and 0.6, or between 0 and 0.5, or between 0 and 0.4, or between 0 and 0.3, or between 0 and 0.2.

In alternative embodiments, it can be a silicon layer, or may comprise silicon. In alternative embodiments, the active device layer is or comprises germanium-tin (GeSn) alloys, III-V materials as, for instance, gallium nitride (GaN), gallium arsenide (GaAs), indium arsenide (InAs), indium antimonide (InSb), indium phosphide (InP), or ternary or quaternary III-V compounds.

It will be appreciated that active layers of final semiconductor devices, such as, for instance, FET transistor devices, are typically mono-crystalline.

In preferred embodiments of the present disclosure, the active layer is crystalline when applying the patterned stress-inducing layer on the common substantially planar surface.

In preferred embodiments of the present disclosure, the active layer is amorphous when applying the patterned stress-inducing layer on the common substantially planar surface.

In preferred embodiments of the present disclosure, the method further comprises a process of amorphizing the active layer before providing the patterned stress-inducing layer on the common substantially planar surface, and the anneal step is performed at a temperature suitable for recrystallizing the amorphized active layer under the induced stress, while being low enough in order not to allow excessive relaxation of the stress-inducing layer.

The amorphization can be performed by any state of the art techniques known to the skilled person. The amorphization can, for instance, comprise an implantation process, such as, for instance, ion implantation.

It has been found that amorphizing the active layer and performing the anneal step at a temperature suitable for recrystallizing the amorphized active layer under the induced stress (e.g., induced stress at annealing temperature), while being low enough in order not to allow excessive relaxation of the stress-inducing layer, will result in less threading dislocations, as the threading dislocations will be deviated towards the contact interface with the isolation structures during regrowth. This can lead to a better quality of the active layer.

In preferred embodiments according to the present disclosure, the patterned stress-inducing layer comprises silicon nitride (SiN). In embodiments according to the present invention, the patterned stress-inducing layer comprises any of or any combination of SiN, titanium nitride (TiN), tungsten (W), silicon oxide ($SiO_x$), hafnium oxide ($HfO_2$), aluminum oxide ($Al_2O_3$), and mixed oxides such as hafnium silicates and/or hafnium aluminates.

According to preferred embodiments of the present invention, the thickness of the patterned stress-inducing layer is between about 5 and about 100 nm, more preferably between about 10 and about 30 nm.

According to preferred embodiments, the method further comprises providing at least one screening layer in between the patterned stress-inducing layer and the common substantially planar surface, the screening layers being adapted for screening part of the stress field induced by the patterned stress-inducing layer, such that the stress field in the active layer is of a sign and magnitude conducive to defect (for instance dislocation) movement in the active layer towards the contact interface during the anneal step. One, two, or a plurality of screening layers can be provided.

It is an advantage that by using the at least one screening layer, the stress field induced by the patterned stress-inducing layer in the active layer, for instance its direction and/or uniformity, can be better controlled.

By appropriately choosing the at least one screening layer and stress-inducing layer, for a certain active device layer, it is possible to generate a shear stress field which is substantially unidirectional in the relevant portions of the active area, and in certain embodiments even substantially uniform.

According to preferred embodiments, the at least one screening layer is an unpatterned, complete layer. The at least one screening layer preferably covers a whole front main surface of an underlying substrate.

It has been shown that such a layer provides an improved performance when compared to one or more patterned screening layers.

According to preferred embodiments, the at least one screening layer comprises a silicon dioxide ($SiO_2$). The $SiO_2$ layer can be deposited by a process of the chemical vapor deposition (CVD) type or atomic layer deposition (ALD) type. The $SiO_2$ may further comprise one or more other element that may affect the mechanical properties of the oxide as for instance the Young's modulus or shear modulus, which may influence the optimal thickness of the oxide. These other elements may for instance comprise one or more of carbon (C), hydrogen (H), nitrogen (N), or fluorine (F).

According to preferred embodiments, the screening layers comprise a first deposited layer comprised mainly of Si and N, e.g., SiN, and a second deposited layer comprised mainly of Si and O, e.g., $SiO_2$.

According to preferred embodiments, providing a patterned stress-inducing layer on the common substantially planar surface comprises providing a unpatterned stress-inducing layer and patterning the unpatterned stress-inducing layer by etching, and wherein the screening layer or upper layer of a plurality of screening layers are adapted for acting as an etch stop layer for a patterned etch of the patterned stress-inducing layer.

According to preferred embodiments, the combined total thickness of the one or more (a plurality of) screening layer(s) is between about 5 and about 50 nm.

It has been shown that thicknesses lying within this range show optimal performance. Other thicknesses are although not excluded.

According to preferred embodiments, the patterned stress-inducing layer comprises/is a silicon nitride layer, an upper screening layer comprises or consists of $SiO_2$, and a lower screening layer comprises or consists of SiN.

For the purpose of the present disclosure, when reference is made to a SiN layers, or SiN stress-inducing layers, it should be understood that these layers mainly comprise silicon and nitrogen. The silicon nitride may have a stoichiometry of approximately $Si_3N_4$, but this may be different. These layers may further comprise impurity elements, as for instance C, H, O, as is typically the case for films deposited by industry standard CVD techniques.

According to preferred embodiments, the anneal step is performed at a temperature between about 450° C. and about 1100° C. According to preferred embodiments, the anneal step is performed at a temperature between about 500° C. and about 650° C.

According to preferred embodiments, the duration of the anneal step is chosen appropriately such that the defects, for instance, dislocations, have enough time to move to the contact interface. The duration can be from one or more milliseconds up to a few, e.g., about 6 hours. Typically, relatively low temperatures will require relatively long durations. The duration is typically a function of the active layer dimension and typical defect or dislocation movement velocity.

According to preferred embodiments, the method further comprises removing the SiN patterned stress-inducing layer in an aqueous solution comprising phosphoric acid, removing the upper screen layer in an aqueous solution containing hydrofluoric acid, and removing a SiN lower screen layer in an aqueous solution containing phosphoric acid. In a particular embodiment, two screen layers (SiOx/SiN) are combined with a SiN patterned stress-inducing layer. The upper screen layer (SiOx) serves as an etch stop for the SiN patterned stress-inducing layer. The lower screen layer (SiN) then serves as an etch stop layer for the upper $SiO_2$ screen layer and protects the isolation oxide that is below it. Finally, the lower screen SiN screen layer is removed with a short etch in hot phosphoric acid.

According to preferred embodiments, the isolation structure comprises SiOx. The isolation structure may for instance comprise or consist of a shallow trench isolation (STI) structure. The STI structure may comprise or consist of silicon oxide.

According to preferred embodiments, the common planar surface is prepared by Chemical Mechanical Polishing (CMP).

According to preferred embodiments, wherein providing a patterned stress-inducing layer comprises providing a stress-inducing layer and patterning the stress-inducing layer, and wherein the patterning of the patterned stress-inducing layer defines features on the common substantially planar surface with boundaries which are substantially parallel to boundaries of the active layer. These substantially parallel boundaries lie at close distance from the boundaries of the active layer, such as, for instance, within a distance smaller than about 30 nm.

In another view, the projection of the patterned stress-inducing layer on the common substantially planar surface defines boundaries which are at least partially substantially parallel, or substantially parallel, to boundaries of the active layer, the substantially parallel boundaries lying at close distance from the boundaries of the active layer, such as, for instance, within a distance smaller than about 30 nm. The projection is preferably an orthogonal projection on the common main surface. It can be an orthogonal projection on a main surface of an underlying substrate.

The patterned stress-inducing layer may define a plurality of stress-inducing structures. Some of these structures may be connected to other stress-inducing structures. It will be appreciated that for connected stress-inducing structures, their respective stress field can be dependent. Some of these structures may be disconnected from any other stress-inducing structures. The patterned stress-inducing layer may define a plurality of disconnected structures. It will be appreciated that for disconnected stress-inducing structures, the respective stress fields are substantially independent.

Advantageously, the stress-inducing layer, or the respective stress-inducing structures, is provided at locations close to the boundaries of the active device layers, to provide an optimal effect. According to preferred embodiments the stress-inducing layer, or the stress-inducing structures, define boundaries, the projections of which are lying substantially parallel to the boundaries of the active device layer. It will be appreciated that an active device layer can be a channel layer of a transistor device. The transistor device can be of the planar or non planar type. A transistor device of the non-planar type can be for instance a transistor of the FinFET type or a similar type as known to the skilled person. It can typically have a longitudinal shape. The projected boundaries of the active device layer on the common main surface, or on a main surface of the underlying substrate, can be, for instance, rectangular, rectangular with rounded corners, elliptical, or any other shape known as suitable to the skilled person.

The projected boundaries of the patterned stress-inducing layer may be substantially parallel, or at least partially substantially parallel, with respective boundaries of active device layer, and may include a plurality of substantially parallel sections with a length corresponding to active device layer length, for instance, the channel layer length.

According to preferred embodiments, adjacent projected substantially parallel boundaries of the patterned stress-inducing layer are positioned within a distance smaller than about 30 nm from different adjacent neighboring channel layers.

This provides the advantage that alignment requirements can be relatively loose, as explained as follows. One can consider adjacent channel regions (example of an active device layer), both being longitudinal and substantially rectangular shaped in projection, the boundaries of the same or different channel regions along the length direction being substantially parallel. A single stress-inducing structure (e.g., also rectangular in projection) can be applied, acting on boundaries in the length direction of different adjacent channel regions. While adjacent projected substantially parallel boundaries of the patterned stress-inducing layer are positioned within close distance from different adjacent neighboring channel layers, such as, for instance within a distance smaller than about 30 nm, the single stress-inducing structure itself can extend over at least one of the adjacent channel regions. The stress-inducing structure can thus have a width which is equal to or larger than the distance between the two adjacent active channel regions. The stress-inducing structure can have a width which is larger than the combined width of two adjacent channel regions and the associated inter-distance (i.e., the separation distance between the two adjacent channel regions). The requirement of "closeness", of the boundaries of channel region boundary and stress-inducing layer/stress-inducing structure boundary, e.g., the requirement of lying within a range of less than about 30 nm, applies to each of the boundaries independently. Moreover, deviations within this range do not substantially impact the effect of the method according to aspects of the present invention.

According to preferred embodiments, the patterned stress-inducing layer is provided fully on an isolation structure, for instance an STI structure.

According to preferred embodiments, the patterned stress-inducing layer is provided at least partially on the active region, for instance, at least partially overlapping the active region.

According to preferred embodiments of the present invention, the patterned stress-inducing layer can be provided such that it is suitable for avoiding or reducing the generation of two partial dislocations from misfit dislocations, wherein providing a patterned stress-inducing layer comprises providing a stress-inducing layer and patterning the stress-inducing layer, and wherein the patterning of the patterned stress-inducing layer defines features on the common substantially planar surface, the features being defined laterally by parallel longitudinal boundaries, the parallel longitudinal boundaries forming an angle different from 0° or 180°, with the contact interface between the active layer and the isolation structure.

In another view, the projection of the patterned stress-inducing layer on the common substantially planar surface defines parallel longitudinal boundaries forming an angle different from 0° or 180°, with the contact interface between the active layer and the isolation structure. The projection is preferably an orthogonal projection on the common main surface. It can be an orthogonal projection on a main surface of an underlying substrate.

According to preferred embodiments, these features comprise a set of substantially parallel rectangular stripes defined by the substantially parallel longitudinal boundaries.

The density of the pattern formed by the set of substantially parallel rectangular stripes, i.e., the number of stripes per distance unit along a direction which is substantially orthogonal with respect to the longitudinal direction of the active layers or regions, is preferably in the same order as the density of the active layers (as for instance fin structures), i.e., number of active regions per distance unit along a direction which is substantially orthogonal with respect to the longitudinal direction of the active regions.

Preferably, the active layer is a Si, Ge or SiGe layer with a (001) crystal orientation, the contact interface between the active layer and the isolation structure is oriented along the <110> direction of the active layer, and an angle $\alpha$ is within the range of about 8.43° to about 28.43°, more preferably within the range of about 13.43° to about 23.43°. According to preferred embodiments, the angle $\alpha$ is about 18.43°.

According to preferred embodiments, the stress-inducing structures extend over at least two adjacent active layers.

According to further embodiment of the present invention, the method according to any of the previous embodiments further comprises one or more iterations of the steps of
   providing a patterned stress-inducing layer on the common substantially planar surface, the stress-inducing layer being adapted for inducing a stress on the active layer, the induced stress resulting in a shear stress on defects, e.g., dislocations, present in the active layer;
   performing an anneal step, and;
   removing the patterned stress-inducing layer from the common planar surface.

According to preferred embodiments, the respective patterned stress-inducing layers comprise a different predetermined pattern, and the combination of stresses induced by the subsequent stress-induced layers induces a movement of said defects, e.g., dislocations, towards the contact interface.

According to preferred embodiments, the method may further comprise performing a CMP process after a last iteration of the removal of the patterned stress-inducing layer and optionally screen layer(s) (if applicable).

According to preferred embodiments, the method further comprises performing a CMP process after the removal of the patterned stress-inducing layer, or at each iteration thereof.

According to preferred embodiments, any of the above methods further may comprise a step of removing an upper part of the active layer. This may provide the advantage that defects remaining in the upper part of the active layer, due for example, to excessively high stress or stress applied in the wrong direction, could be effectively removed. Thus, the remaining, high crystal-quality part of the active layer is available for the fabrication of devices. For the purpose of the present disclosure, whenever ranges are defined, it is intended to disclose these ranges in their closed, open, and two half open forms. All these options are meant to be disclosed even if the term "between" is used in the context of defining such ranges.

BRIEF DESCRIPTION OF THE DRAWINGS

The disclosure will be further elucidated by means of the following description and the appended figures.

FIGS. 10-12 illustrate embodiments according to the present invention.

DETAILED DESCRIPTION

Figure 1:
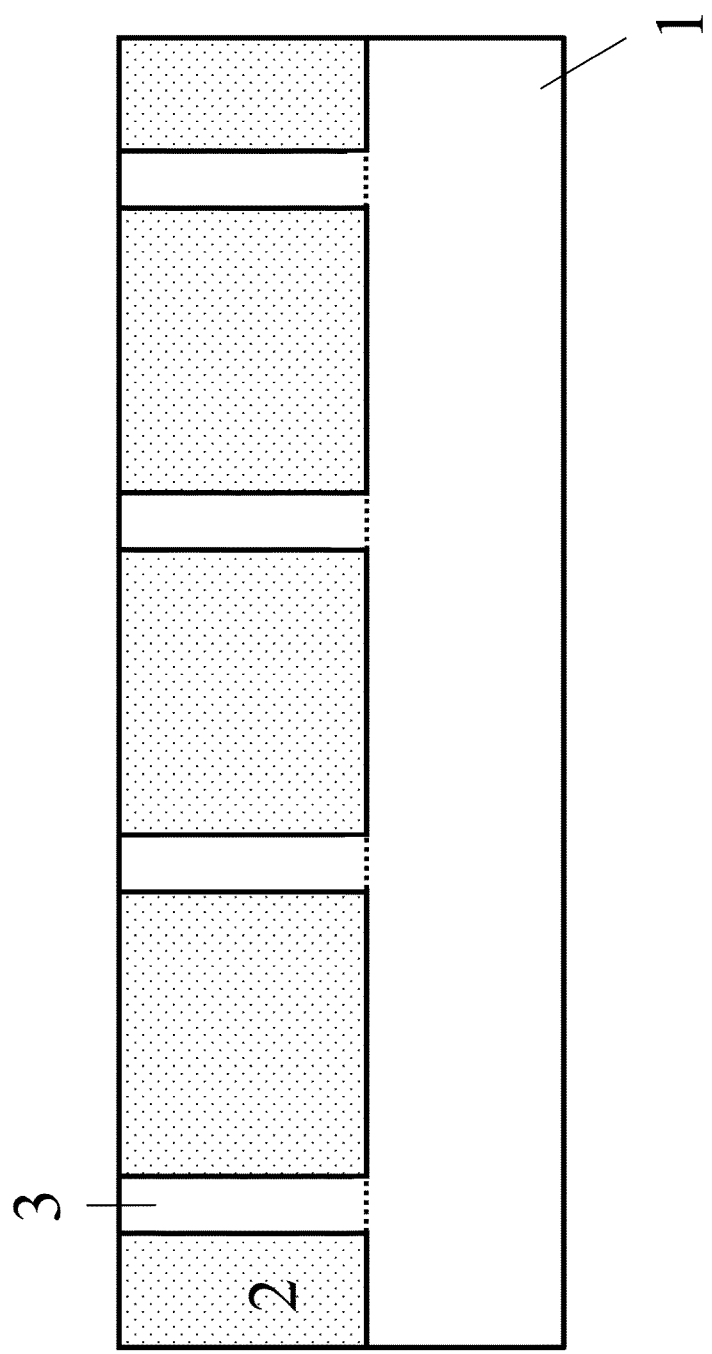
FIG. 1 illustrates a wafer after processing of a standard STI module.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIG. 1 provides a schematic wafer cross section after a standard shallow trench isolation flow. This comprises a base substrate 1, for instance a silicon substrate, a dielectric layer 2 provided on a first main surface of the base substrate 1, for instance a $SiO_x$ layer, and a set of active layers or regions 3 within the dielectric layer 2 that are connected to the base substrate 1. The active layers or regions 3 are electrically separated from each other by means of portions of the dielectric layer 2. At this point in the process flow, the active layers or regions 3 are typically comprised of the same material as the base substrate, which is typically Si.

Figure 2:
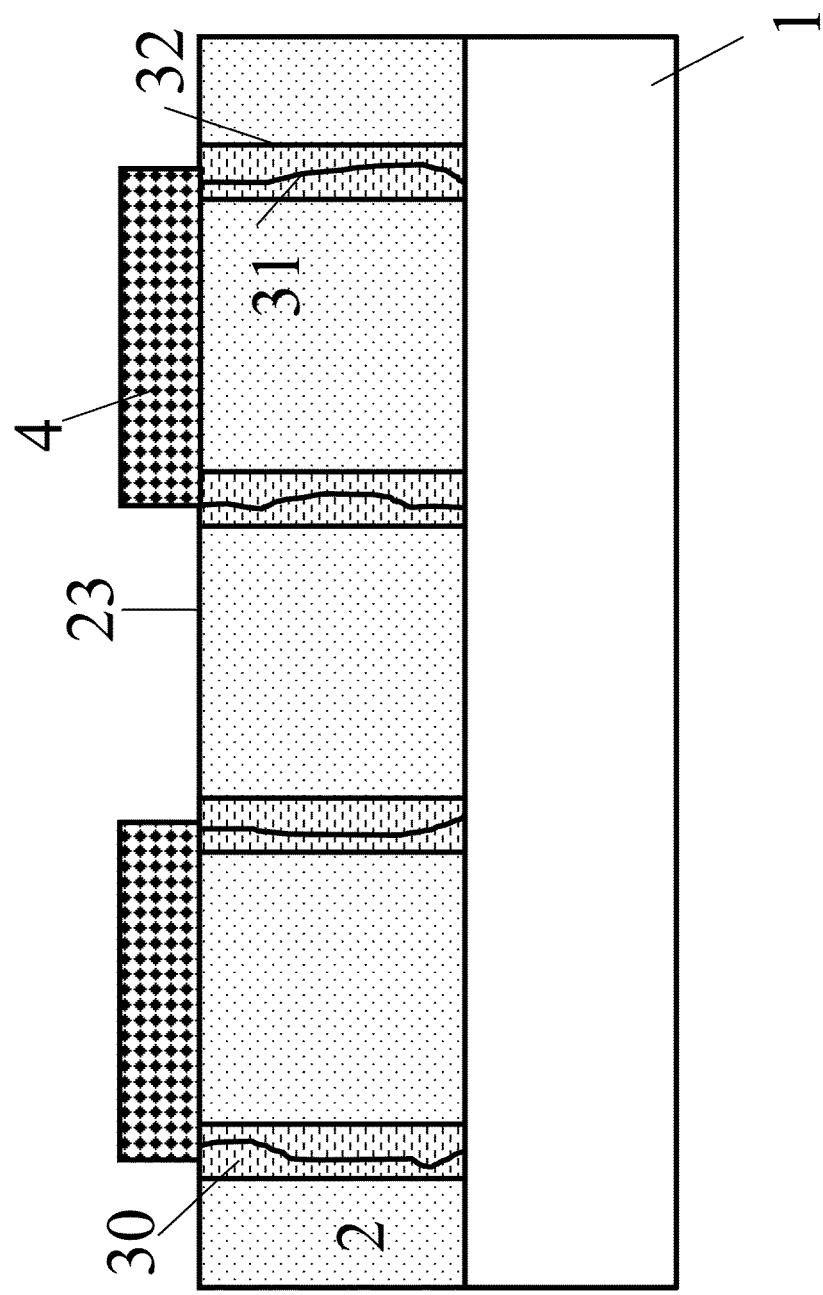
FIG. 2 illustrates a first embodiment of the present invention.

In FIG. 2, a process flow according to embodiments of the present invention is disclosed. The active layers or regions 3 of FIG. 1 are recessed by, for instance, etching the Si in the trenches. Then, selective epitaxial growth of Ge or SiGe is performed within the trenches, to define an active device area 30, layer or structure. Optionally, an anneal step can be performed. A planarization step such as for instance a CMP step may be performed, in order to remove SiGe (or Ge) overgrowth above the trench opening, and to provide a planar surface 23, which can be seen as a common substantially planar surface for the active device layer or active layer. For illustrative purposes, only one threading dislocation line 31 is indicated per active device area 30.

A stress-inducing layer 4 is then provided on top of the common planar surface 23, for instance, a stressed SiN layer or film can be deposited. The stressed SiN layer is then patterned using standard lithography and etching techniques.

An anneal step is then performed at temperatures sufficient to allow the movement of threading dislocations 31 towards the interface 32 between the active device layer 30 and the isolation structure 2. However, the anneal temperature should not be so high as to allow excessive relaxation of the patterned stress-inducing layer. Typical annealing temperatures are between about 450° and about 1100° C., depending upon the geometry of the structure and the composition of the active lines. The patterned stress-inducing layer is then removed or stripped using standard techniques as for instance by means of etching with hot phosphoric acid for a SiN stressed film. Optionally, a planarizing step as a CMP process can be performed now to remove any topography or damage from inserted processing. Standard downstream processing can then further be performed.

Figure 3:
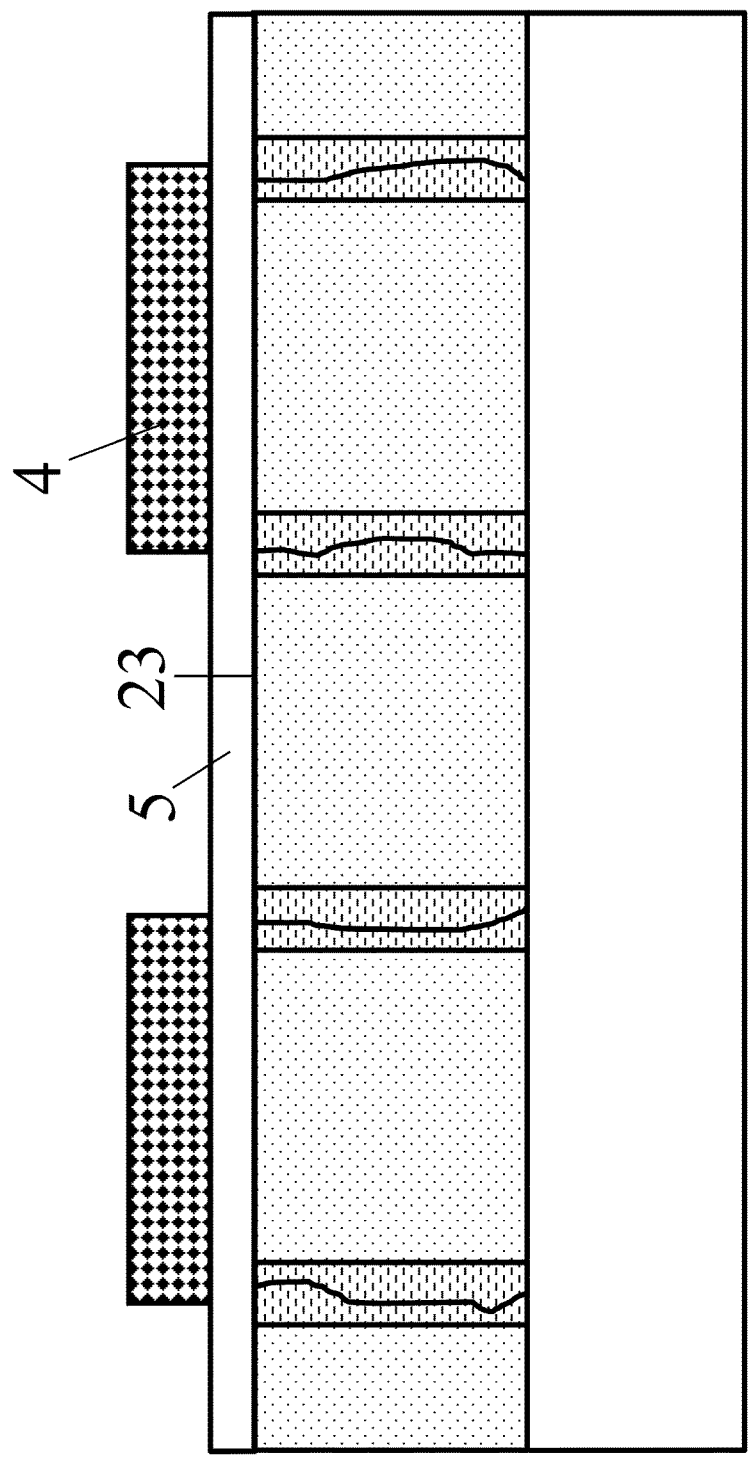
FIG. 3 illustrates a further embodiment of the present invention.

In FIG. 3 a further embodiment is depicted, wherein a single screening layer 5 is provided in between the stress-inducing layer 4 and the common substantially flat surface 23. The screening layer can for instance be or comprise silicon oxide or silicon nitride.

Figure 4:
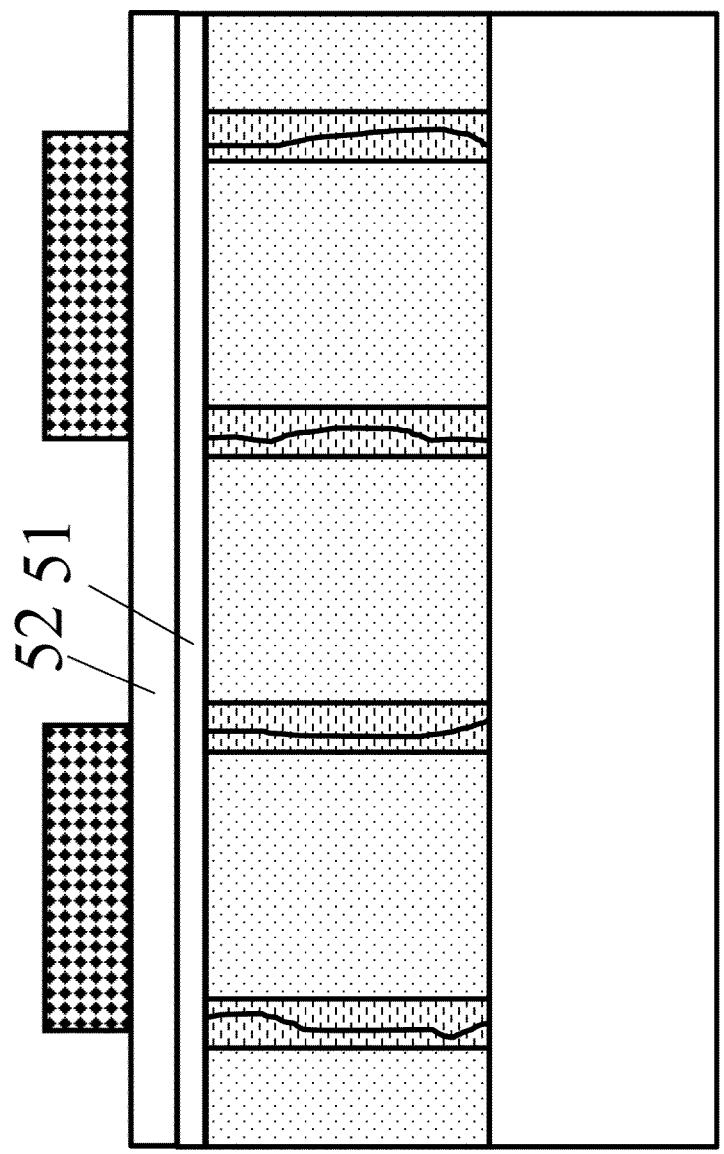
FIG. 4 illustrates a further embodiment of the present invention.

In FIG. 4 a further embodiment is depicted, wherein a plurality of screening layers, for instance, two screening layers 51 and 52, are provided in between the stress-inducing layer 4 and the common substantially flat planar surface 23.

Figure 5:
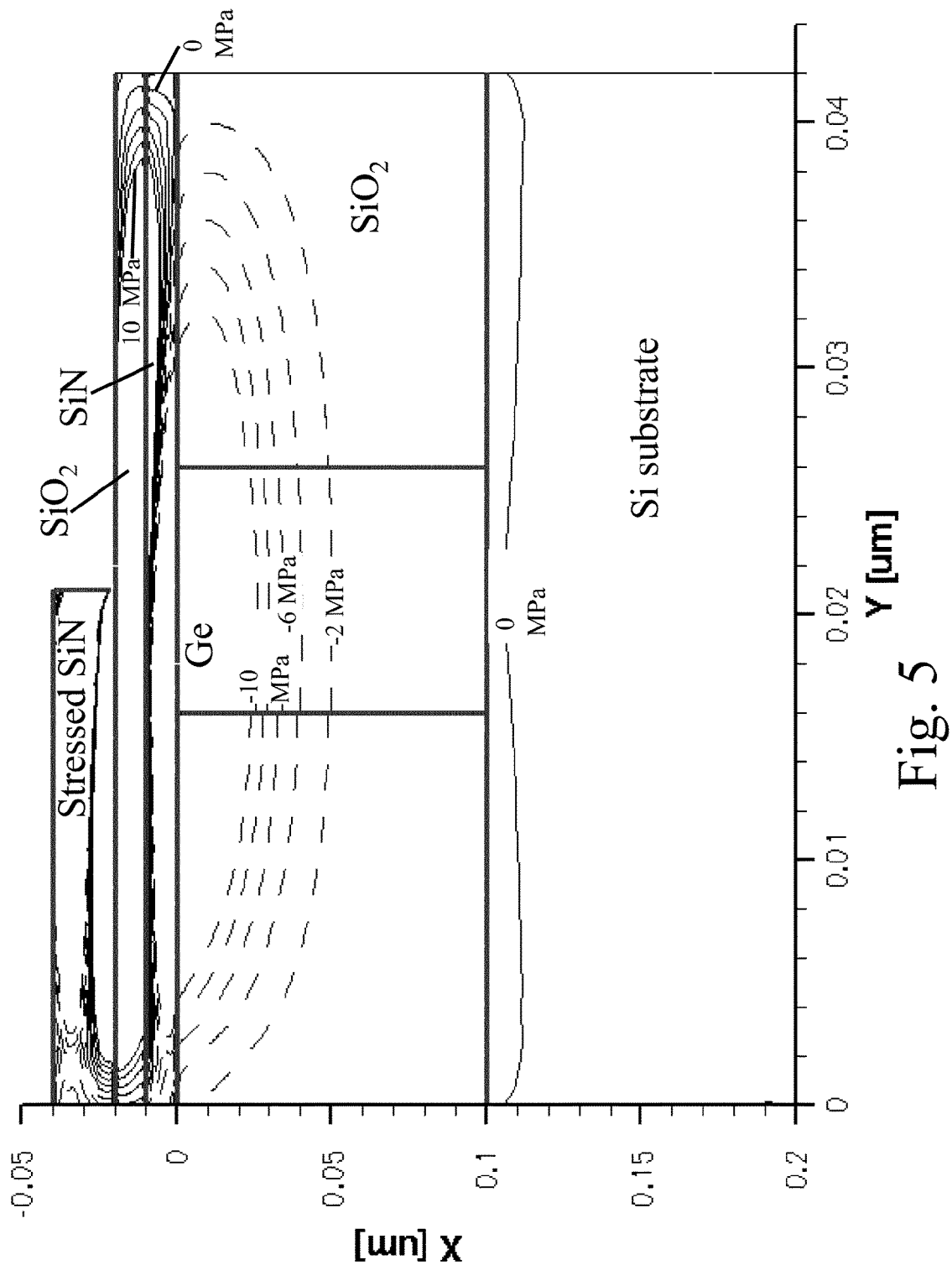
FIGS. 5-9 show simulation results supporting embodiments of the present invention.

In FIG. 5 simulation results are depicted which illustrates the nature of the shear stress fields being induced by the stress-inducing layer 4 for the case corresponding to FIG. 4, wherein a Ge active layer 30 within a $SiO_2$ dielectric layer 2 is subjected to stress induced by a 20 nm thick stress-inducing layer of SiN at a intrinsic stress of 2 GPa. The first screening layer 51 comprises a SiN, having a thickness of 10 nm. The second screening layer 52 comprises a $SiO_2$, also having a thickness of 10 nm.

It can clearly be seen that the screening layers indeed screen off a portion of the stress field, such that the complementary portion in the active layer 3 is in a shear stress state of largely constant sign (negative in this case). As the direction of movement of a dislocation is determined by the sign of the applied shear stress, having a substantially constant sign for the shear stress down the depth of the active layer 3 insures that the dislocation is consistently moving in the same direction (either left or right, depending upon the burgers vector of the dislocation) along the depth of the active line.

Note that the screen layers 51, 52 (e.g. $SiO_2$, SiN) under the stress-inducing layer 4 are unpatterned, and serve to better "absorb" the top sign of the shear stress, allowing only a single sign for shear stress in the active layer. The active layer can, for instance, be a fin of a transistor device such as, for instance, a FinFET device.

Figure 6:
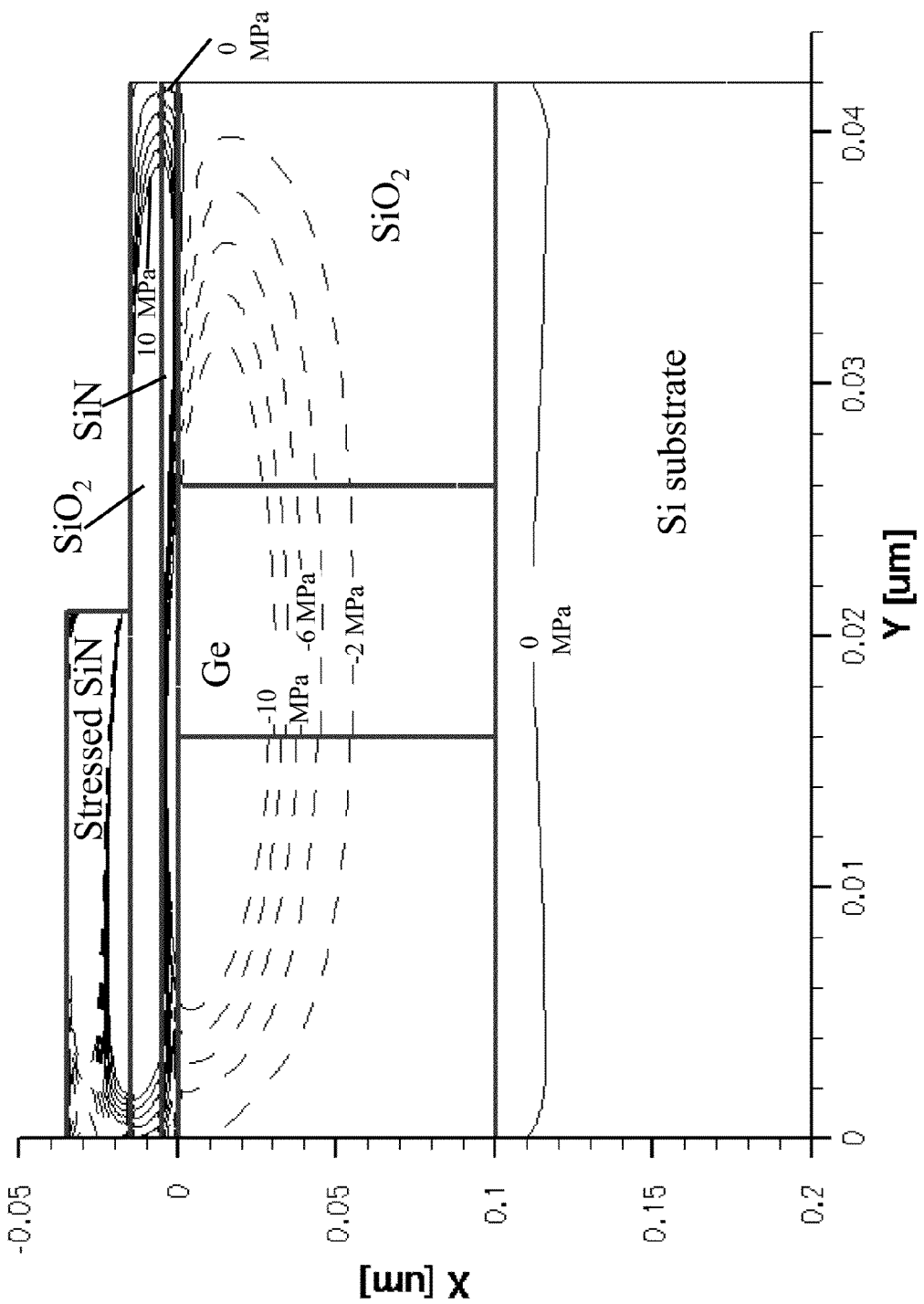

According to preferred embodiments, the total thickness of the screening layers is about 20 nm, which is believed to be sufficient, but it may be thicker or thinner than 20 nm. As an example, FIG. 6 depicts the same conditions as FIG. 5, but the screen nitride is thinned to 5 nm, for a total screening layer thickness of 15 nm. Depositing a first screening layer 51 comprising a SiN and then a second screening layer 52 comprising the $SiO_2$ before the stress-inducing layer 4, allows the $SiO_2$ to be an etch stop layer for the removal of the stress-inducing layer 4, and allows the screen nitride to be an etch stop for removal of the screen oxide while protecting the dielectric layer 2, e.g. the STI structure.

Figure 7:
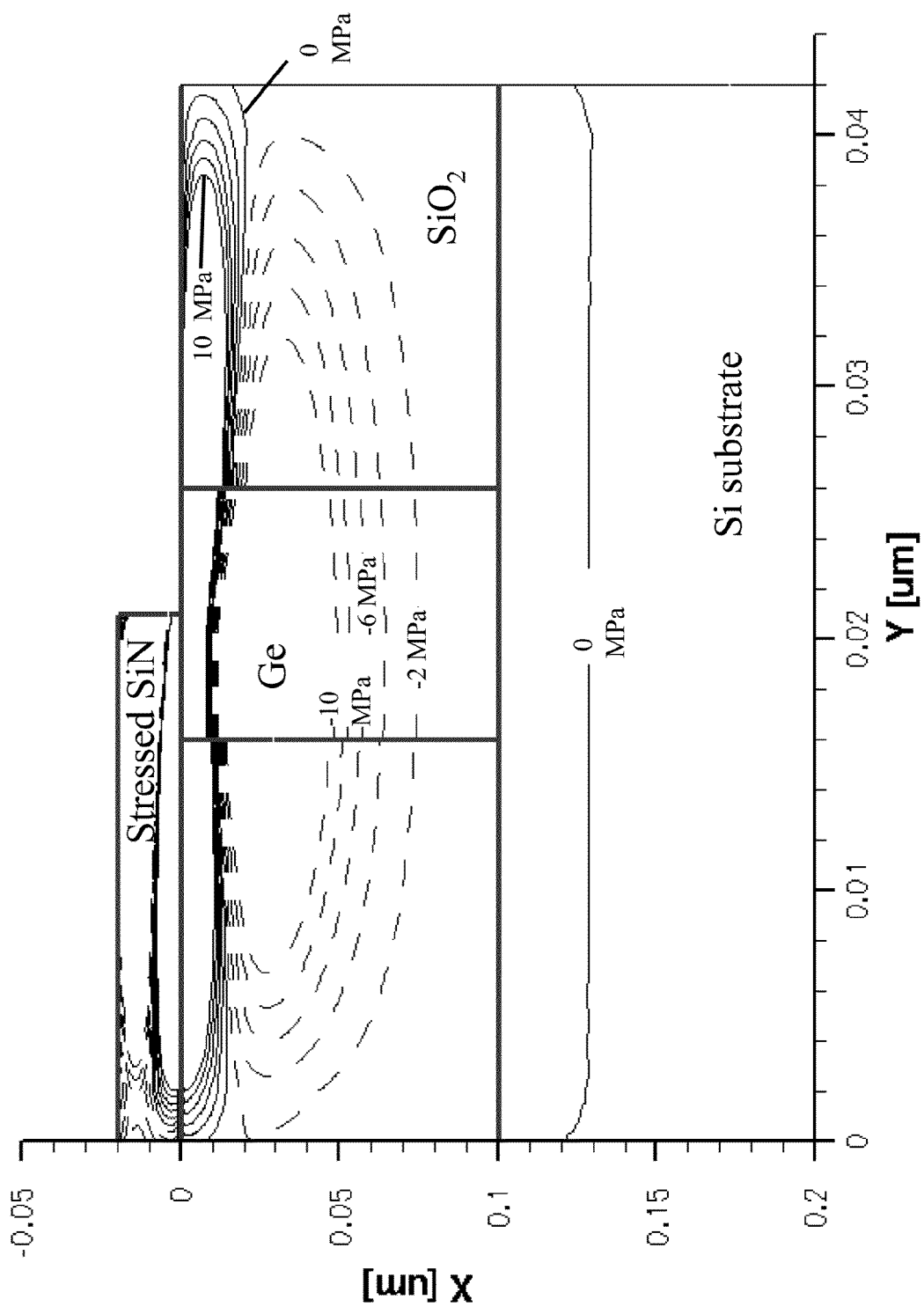

In FIG. 7, simulation results are shown for the same conditions as for FIG. 5, but without the 10 nm screening oxide and 10 nm screening nitride layers. Here, high levels of positive and negative shear stress are seen in the active layer, e.g. in the channel layer 30. While eliminating the screen layers allows the shear stress to be induced in the deeper, lower part of the active layer, the direction of the shear stress at the top or upper part of the active layer is different than in the rest of the line. According to certain embodiments of the present disclosure, the method may further comprise a step of removing the upper part of the active layer. It can be removed, for instance, by etching or polishing (e.g. CMP). Optionally, the upper part of the active layer can be replaced with a different material, e.g., a new upper part can be provided on the lower part. The different material can, for instance, comprise a high mobility channel material having a high electron and/or hole mobility. The removal can be performed for instance after removal of the stress-inducing layer or after the removal of the screening layer if present.

Figure 8:
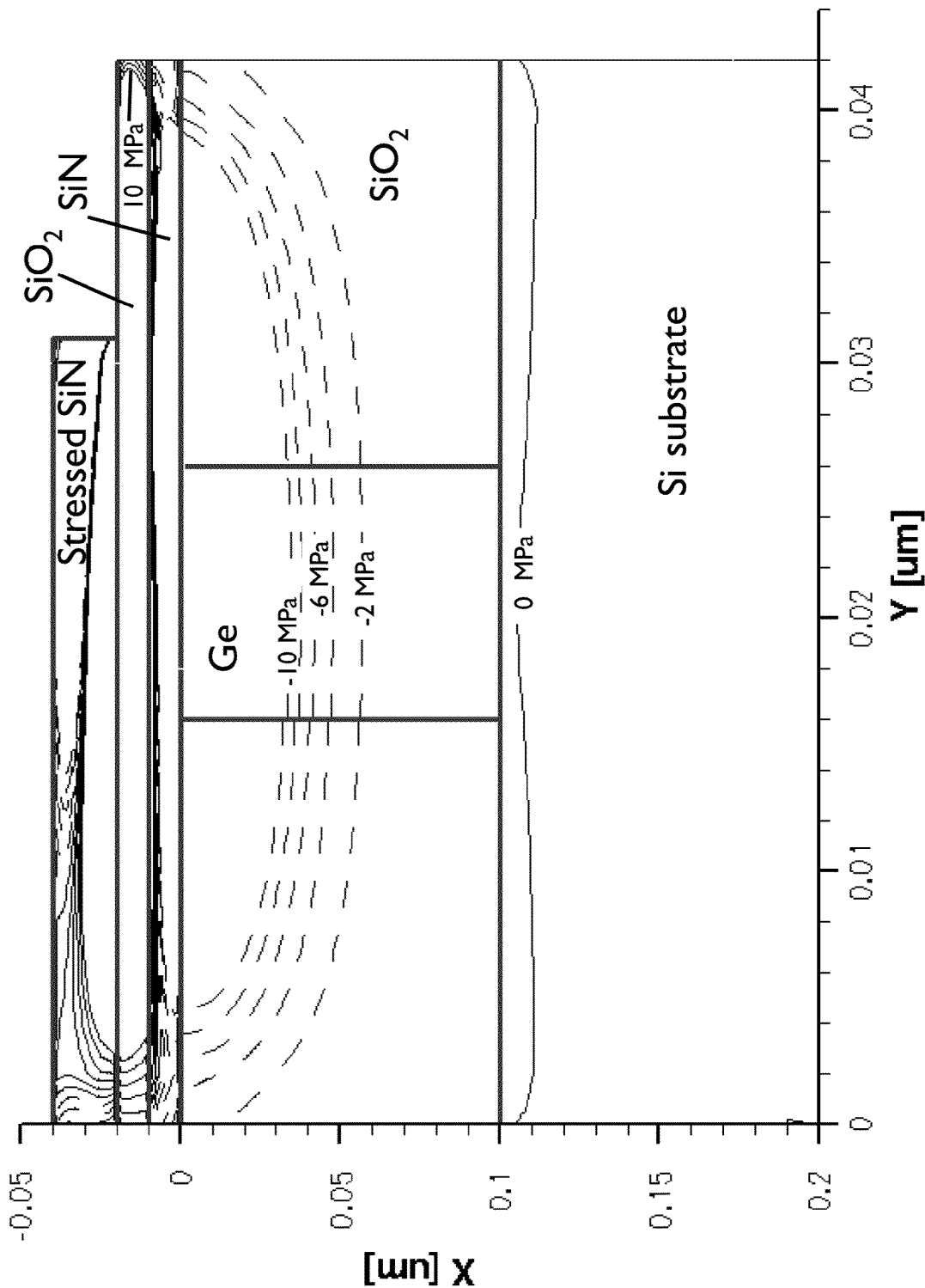

Preferably, the mask boundary for the stress-inducing layer 4 with unpatterned screen layer 5, 51, 52 is provided over the active layer (as for instance over fin), but it is an advantage that the results are not substantially influenced by small deviations there from as, for instance, due to photolithography registration errors. The alignment of the respective boundary of the stress-inducing layer 4 with the interface 32 is shifted 10 nm to the right in FIG. 8 as compared to FIG. 5.

Conditions are the same as for FIG. 5. Despite the 10 nm shift in photolithography registration, the stress field in the Ge active layer is similar.

Figure 9:
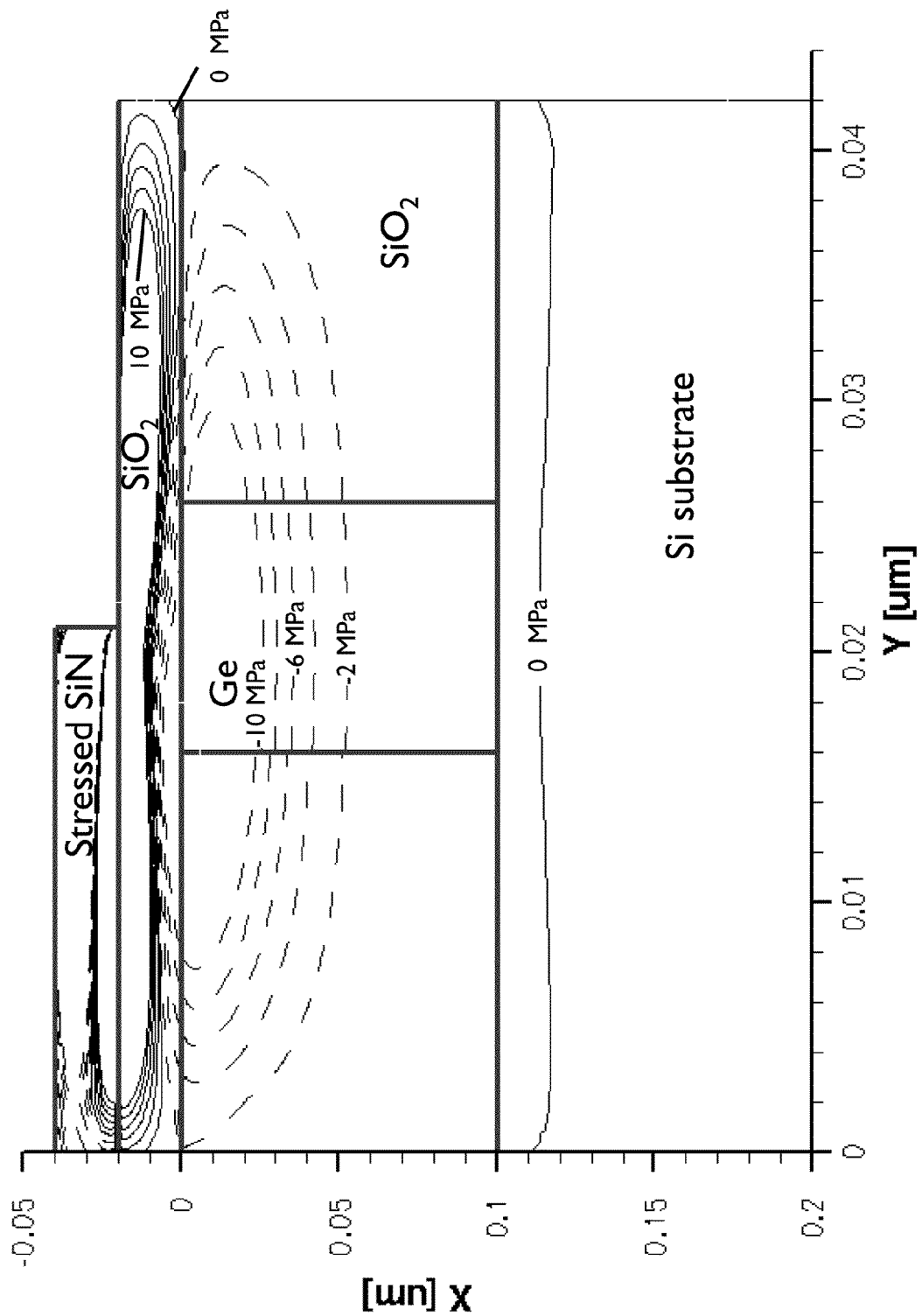

FIG. 9 shows further simulation results for embodiment using a single, unpatterned screening layer, here an unpatterned $SiO_2$. Here, the same conditions are used as in FIG. 5, but only a single 20 nm $SiO_2$ screen layer is used. Once again, shear stress levels in the Ge layer are similar to that for FIG. 5.

In FIGS. 10, 11, and 12, different embodiments according to the present disclosure are depicted, whereby different relative orientation and dimensioning of stress-inducing layer 4 and active layer or active regions 30 are considered. In FIG. 10 the shear stress is maximized in the active layer 30, whereby the stress-inducing layer 4 (or layer structure) partially overlaps with each of two adjacent active layers or regions 3. The boundaries of the stress-inducing layer 4 are thereby for instance positioned in the middle of the respective active layers 3.

In FIG. 11 the stress-inducing layer 4 (or layer structure) completely overlaps with each of two adjacent active layers or regions 30. Such overlap is asymmetrically with respect to active layers or regions 3.

In FIG. 12 a further embodiment is depicted, wherein the stress-inducing layer 4 is provided in between the active layers 3 only, i.e. is provided on the isolation or dielectric layer only.

Preference between embodiments as described in FIGS. 10, 11, and 12 and other embodiments will be an issue of optimization of lithographic, integration, and dislocation reduction constraints.

It will be appreciated that the skilled person is able to derive appropriate durations of the anneal step, given a predetermined process. This can for instance be based on active layer material and dimension, material systems used, magnitude of induced shear stress, and temperature of the anneal step. Background information can for instance be retrieved in "Velocities of Individual Dislocations in Germanium", J. R. Patel and P. E. Freeland, Journal of Applied Physics, 42, 3298-3303 (1971) ("PATEL").

Table 1 illustrates dislocation velocity calculations in Ge at temperatures of 500° C. and 580° C., based on the model and data in "PATEL". Here, the relation $v=v_0(tau/tau_0)^m$ is used, wherein v is dislocation velocity, tau is resolved shear stress, and $v_0$, $tau_0$, and m are fitting parameters in the equation. The values for $v_0$, $tau_0$, and m are temperature and material dependent. For example, at 500° C., a 1 nm/s dislocation movement velocity is achieved at an approximately 1.5 MPa shear stress for germanium. For the same material system, at a temperature of 580° C., the same 1 nm/s dislocation movement velocity is achieved with only a 50 kPa shear stress.

TABLE 1

| | Temperature (° C.) | |
|---|---|---|
| | 500 | 580 |
| $v_0$ (nm/s) | 400 | 5000 |
| $tau_0$ (MPa) | 10 | 10 |
| m | 3.2 | 1.6 |
| tau (MPa) | v (nm/s) | v (nm/s) |
| 10 | 400.000 | 5000.000 |
| 5 | 43.528 | 1649.385 |
| 3 | 8.489 | 728.390 |
| 2 | 2.319 | 380.731 |

TABLE 1-continued

| | | |
|---|---|---|
| 1 | 0.252 | 125.594 |
| 0.5 | 0.027 | 41.431 |
| 0.3 | 0.005 | 18.296 |
| 0.2 | 0.001 | 9.564 |
| 0.1 | 0.000 | 3.155 |
| 0.05 | 0.000 | 1.041 |
| 0.03 | 0.000 | 0.460 |
| 0.02 | 0.000 | 0.240 |
| 0.01 | 0.000 | 0.079 |

In the embodiment described above, the active layer was of originally of crystalline nature, and the stress-inducing layer or layers and optional screening layer(s) are formed directly on this crystalline active layer.

According to alternative embodiments of the present invention, the active layer can be amorphous when applying the patterned stress-inducing layer on the common substantially planar surface. The active layer may be crystalline originally, and can be amorphized, i.e., can be made amorphous on purpose, for instance, by a dedicated implantation process. The anneal step can then advantageously be performed at a temperature suitable for recrystallizing the amorphized active layer under the induced stress, while being low enough in order not to allow excessive relaxation of the stress-inducing layer. For instance, for Ge, the temperature is preferably within the range of about 400° to about 700° C.; a typical temperature could be about 500° C. For SiGe and Si, the temperature is preferably within the range of about 500° C. to about 800° C.; a typical temperature could be for instance about 600° C., for instance for SiGe comprising about 80% Ge.

The amorphization can be performed by any state of the art techniques known to the skilled person. The amorphization can for instance comprise an implantation process as for instance ion implantation.

It has been found that amorphizing the active layer and performing the anneal step at a temperature suitable for recrystallizing the amorphized active layer under the induced stress (e.g., induced stress at annealing temperature), while being low enough in order not to allow excessive relaxation of the stress-inducing layer, will result in less threading dislocations, as the threading dislocations will be deviated towards the contact interface with the isolation structures during regrowth. This can lead to a better quality of the active layer.

A typical process flow for producing a FET transistor device based on embodiments of the present invention is described below, in which the amorphizing step and associated limitation on the anneal step are optional.

A standard STI structure is used as a starting point. The active silicon portion is recessed. Then a selective epitaxial growth of SiGe or Ge is performed.

An anneal step is then advantageously applied to remove part of the threading dislocation present in the SiGe or Ge layer. A CMP process is then performed in order to remove SiGe overgrowth and recover the common substantially planar surface. Optionally an amorphizing implant is now performed into the SiGe or Ge layer. For instance, a typical amorphizing implant can be a Ge implant, with an energy of about 100 keV, and a dose of about 1e15 $cm^{-2}$. One or more screening layers are then deposited, e.g., SiN, then $SiO_2$. A stress-inducing layer of SiN can then be deposited on top, and can then be patterned by standard lithography and etching techniques. An anneal step is then performed to remove dislocations in the active area, whereby the anneals step is optionally at a temperature which is sufficient to recrystallize the active layer under stress, in this option preferably under shear stress, but which is not too high as to not allow excessive relaxation (e.g., relaxation by more than 10%, more than 20%, more than 30%, more than 40%, more than 50%, more than 60%, more than 75%, more than 90%, more than 95%, more than 99%) of the stress exerted by the stress-inducing layer and, if present, the screening layer(s) at the annealing temperature. The duration of the anneal step can be for instance within the range of a few seconds to about 30 minutes. The stress-inducing layer(s) is tripped (for instance, by using hot phosphoric acid for SiN), as well as the screening layer(s), by state of the art techniques. Optionally, a further CMP step can be applied on the front surface in order to remove any topography or damage with could possible have been generated by the process. Further, standard processing can be applied.

The above examples illustrate how aspects of the present invention are suitable for removing defects from an active layer of a semiconductor device, especially how threading dislocations can be removed from an active layer.

Figure 13:
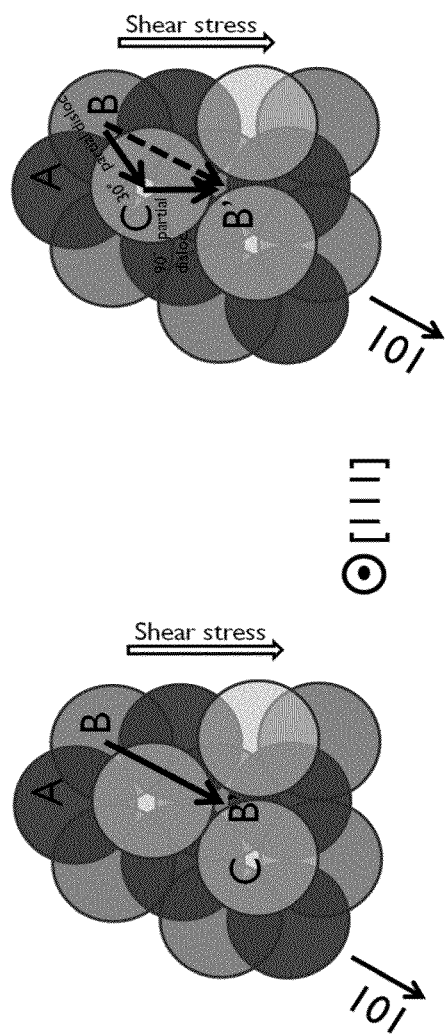
FIG. 13 illustrates the concept of misfit dislocation dissociation.

Another type of dislocations however, misfit dislocations, generated during strain relaxation in the active layer, can sometimes dissociate into two partial dislocations. The left figure of FIG. 13 illustrates a perfect a/2 101 dislocation 101 in planes 111. The right figure of FIG. 13 illustrates the dissociation of a perfect a/2 101 dislocation 101 in the planes 111 in a 30° partial dislocation and a 90° partial dislocation. As soon as those partial dislocations are separated from each other, stacking faults in the planes 111 are formed. Those defects are planar and are fixed. They cannot be manipulated by any of the previously described thermal anneal steps. Stacking faults are formed along the trenches defined by the contact interface between the active layer and its adjacent isolation structures, and cannot be removed afterwards.

Therefore, a further aspect of the present invention is directed to reducing or avoiding the occurrence of the two partial dislocations and thus stacking faults from misfit dislocations.

In order to get defect free trenches filled with relaxed Ge or SiGe, the stacking faults formation is avoided, or the probability of its occurrence reduced, from the beginning.

Such stacking faults are formed when the two partial dislocations get separated from each other after initial perfect dislocation dissociation, the 30° and the 90° partial dislocations. The separation occurs when the difference of stress is too important between the one applied on the 30° and on the 90° partial dislocation. The 90° partial dislocation has a relatively higher stress since it has the same directions than the shear stress applied on the planes 111 by the lattice mismatch between the epitaxial active layer and the substrate.

In order to reduce the difference of stress on the two partial (30° and 90°) dislocations, an additional shear stress is applied on the 30° dislocation in order to compensate this difference. It will then avoid the separation of the perfect dislocation. The additional shear stress can be applied by a stress-inducing layer, possibly combined with a screening layer as described for any of the other embodiments of the present invention, at least partially covering the active layer. The stress-inducing layer and the provisioning thereof can be as described in any of the other embodiments, but is preferably patterned in a different way. Preferably, the patterned stress-inducing layer defines features on the common substantially planar surface, the features being defined laterally by parallel longitudinal boundaries, the parallel longitudinal boundaries forming an angle α different from about 0° or about 180° with the contact interface between said active layer and said isolation structure. Preferably, the set of parallel rectangular stripes is defined by the parallel longitudinal boundaries.

Figure 14:
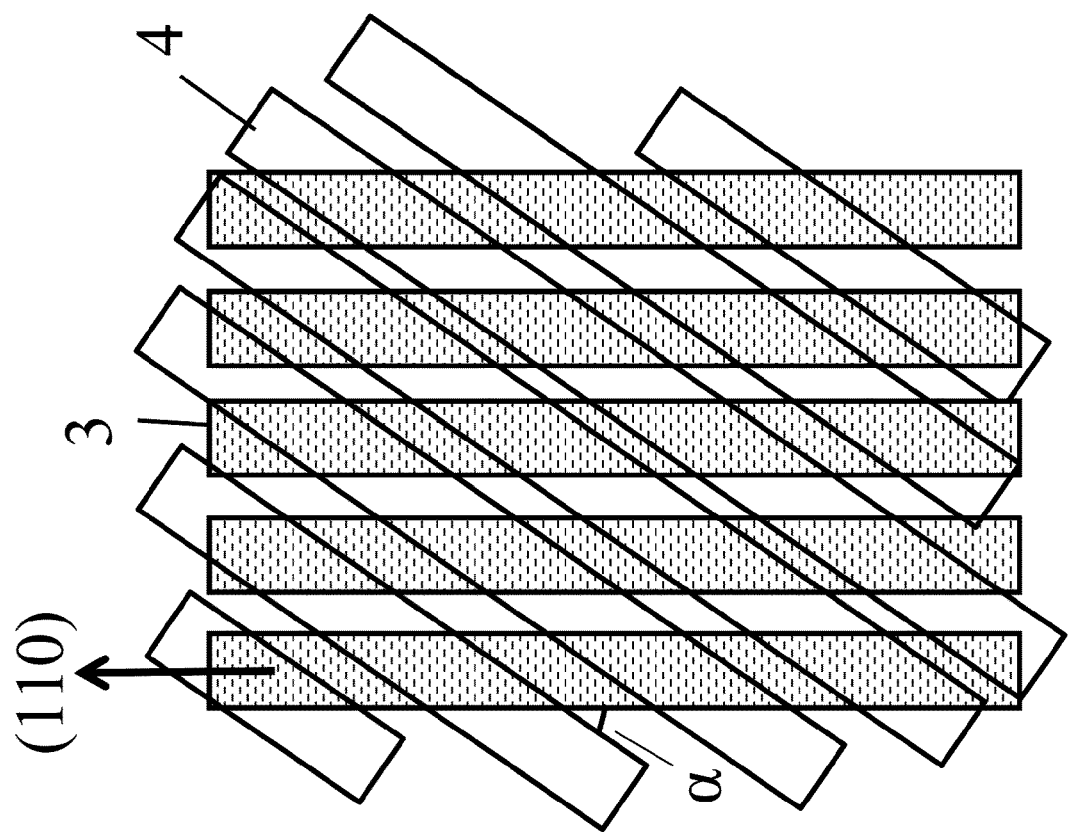
FIG. 14 illustrates an embodiment of the present disclosure.

The density of the pattern formed by the set of parallel rectangular stripes, i.e., the number of stripes per distance unit along a direction which is substantially orthogonal with respect to the longitudinal direction of the active layers or regions, is preferably in the same order as the density of the active layers (as for instance fin structures), i.e., number of active regions per distance unit along a direction which is substantially orthogonal with respect to the longitudinal direction of the active regions. An example of a pattern of such a stress-inducing layer is depicted in FIG. 14.

According to preferred embodiments, when the active layer is a Si, Ge, or SiGe layer with a crystal orientation direction 110, and wherein the contact interface between the active layer or region 3 and the isolation structure is oriented along the direction of the crystal orientation direction 110 of the active layer or region 3, the angle α is within the range of about 8.43° to about 28.43°, more preferably the angle α is within the range of about 13.43° to about 23.43°. In a preferred embodiments, the angle α is or is about 18.43°. This will increase the stress level on this partial dislocation in order to avoid the dissociation. This range can be determined as follows. Growth on substrate 1 is considered with trenches, or contact interfaces between the active layers or regions 3 and the isolation structures 2 adjacent thereto, being oriented in the crystal orientation direction 110. If relaxation occurs only via dislocations, which is in a certain view ideal as the defects can be removed, about 60° misfit dislocation are created with a dislocation line along the crystal orientation direction 110 and with a Burger vector equal to α/2 101 (the angle between the dislocation line and the burger vector is about 60°). If to the contrary, relaxation occurs via Stacking Faults formation (not ideal, since these are fixed defects), this is due to the dissociation of the later about 60° relaxation into two about 30° and about 90° partial dislocations and the further separation of them, due to a higher shear stress on the about 90° dislocation as compared to the about 30° dislocation, because the 90° dislocation burger vector is in the [111] planes. The about 30° dislocation is still along the crystal orientation direction 110 with a Burger vector equal to α/6. The about 90° dislocation is still along the crystal orientation direction 110 with a Burger vector equal to α/6.

According to aspects of the present invention, an additional shear stress is exerted on the 30° dislocation in order to compensate the higher stress on the 90° dislocation. This can avoid 30° and 90° dislocation separation or in other words would make the 60° dislocation dissociation impossible.

In order to be optimal, the additional shear stress is preferably aligned with the 30° dislocation burger vectors α/6. The projection of this vector on the planes 111 is α/6 direction. This projected vector has then an angle of about 18.43° with the trench orientation. It will be appreciated by the skilled person that deviations of about 10°, or deviations of about 5°, of the angle α would still be suitable for providing a substantial effect, although the effect is expected to be smaller for larger deviations from about 18.43°.

What is claimed is:

1. A method for reducing defects in an active layer of a semiconductor in a semiconductor device, wherein the active layer (i) comprises one of silicon, germanium, or silicon germanium, (ii) has a crystal orientation direction, (iii) is at least laterally defined by an isolation structure, and (iv) is physically in contact with the isolation structure at a contact interface that is oriented along the crystal orientation direction of the active layer, wherein the isolation structure and the active layer abut on a common planar surface, wherein the method comprises:
providing a patterned stress-inducing layer on the common planar surface, wherein (i) the stress-inducing layer is adapted for inducing a stress field in the active layer, (ii) providing the patterned stress-inducing layer defines features on the common planar surface, wherein the features are defined laterally by parallel longitudinal boundaries forming an angle with the contact interface between the active layer and the isolation structure and the angle is within a range of about 8.43° to about 28.43°, and (iii) the induced stress field results in a shear stress on a defect in the active layer;
performing an anneal step after providing the patterned stress-inducing layer on the common planar surface; and
removing the patterned stress-inducing layer from the common planar surface.

2. The method of claim 1, wherein the at least one active layer is amorphous when applying the patterned stress-inducing layer on the common planar surface, and wherein the method further comprises amorphizing the active layer prior to providing the patterned stress-inducing layer on the common planar surface.

3. The method of claim 2, wherein the anneal step is performed at a temperature suitable for recrystallizing the amorphized active layer under the induced stress and to minimize excessive relaxation of the stress-inducing layer.

4. The method of claim 2, wherein providing the patterned stress-inducing layer comprises providing a stress-inducing layer and patterning the stress-inducing layer, wherein patterning the stress-inducing layer defines the features on the common planar surface.

5. The method of claim 1, wherein the angle is about 18.43°.

6. The method of claim 1, wherein the patterned stress-inducing layer comprises silicon nitride.

7. The method of claim 1, wherein the thickness of the patterned stress-inducing layer is between about 5 nm and about 100 nm.

8. The method of claim 1, further comprising:
providing at least one screening layer in between the patterned stress-inducing layer and the common planar surface, wherein the at least one screening layer is adapted for screening part of the stress field induced by the patterned stress-inducing layer such that the stress field in the active layer is of a sign and a magnitude conducive to defect movement in the active layer towards the contact interface during the anneal step.

9. The method of claim 8, wherein the at least one screening layer is an unpatterned, complete layer.

10. The method of claim 8, wherein the at least one screening layer comprises a silicon oxide.

11. The method of claim 8, where the at least one screening layer comprises a first deposited layer comprising silicon and nitrogen and a second deposited layer comprising silicon and oxygen.

12. The method of claim 8, wherein providing the patterned stress-inducing layer on the common planar surface comprises:
providing an unpatterned stress-inducing layer; and
patterning the unpatterned stress-inducing layer by etching, wherein at least one of the at least one screening layers is adapted for serving as an etch stop layer for a patterned etch of the patterned stress-inducing layer.

13. The method of claim 8, wherein the combined total thickness of the at least one screening layers is between about 5 nm and about 50 nm.

14. The method of claim 8, wherein the patterned stress-inducing layer comprises:
   a silicon nitride layer,
   an upper screening layer that comprises a silicon oxide; and
   a lower screening layer comprises silicon nitride.

15. The method of claim 1, wherein the active layer comprises a germanium layer.

16. The method of claim 1, wherein the active layer comprises a $Si_xGe_{1-x}$ layer, where x is between about 0 and about 0.8.

17. The method of claim 1, wherein the anneal step is performed at a temperature between about 450° C. and about 1100° C.

* * * * *